(12) United States Patent  (10) Patent No.: US 7,833,869 B2
Nouri et al.  (45) Date of Patent: Nov. 16, 2010

(54) METHODS FOR FORMING A TRANSISTOR

(75) Inventors: Faran Nouri, Los Altos, CA (US); Lori D. Washington, Union City, CA (US); Victor Moroz, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 12/181,942

(22) Filed: Jul. 29, 2008

(65) Prior Publication Data

US 2008/0280413 A1  Nov. 13, 2008

Related U.S. Application Data

(63) Continuation of application No. 11/123,588, filed on May 6, 2005, now Pat. No. 7,413,957.

(60) Provisional application No. 60/583,079, filed on Jun. 24, 2004.

(51) Int. Cl.
 *H01L 21/336* (2006.01)
(52) U.S. Cl. ............................ 438/300; 257/E21.431
(58) Field of Classification Search ................ 438/300, 438/429; 257/E21.431
 See application file for complete search history.

(56) References Cited

U.S. PATENT DOCUMENTS

| 5,168,072 | A | 12/1992 | Moslehi |
| 6,121,100 | A | 9/2000 | Andideh et al. |
| 6,403,482 | B1 * | 6/2002 | Rovedo et al. ............... 438/689 |
| 6,566,254 | B1 | 5/2003 | Mikagi et al. |
| 6,621,131 | B2 | 9/2003 | Murthy et al. |
| 7,413,957 | B2 | 8/2008 | Nouri et al. |
| 2002/0053711 | A1 | 5/2002 | Chau et al. |
| 2002/0190284 | A1 | 12/2002 | Murthy et al. |
| 2003/0080361 | A1 | 5/2003 | Murthy et al. |
| 2003/0098479 | A1 | 5/2003 | Murthy et al. |
| 2004/0033678 | A1 | 2/2004 | Arghavani et al. |
| 2004/0070035 | A1 | 4/2004 | Murthy et al. |
| 2004/0084735 | A1 | 5/2004 | Murthy et al. |

OTHER PUBLICATIONS

Notification of First Office Action dated Aug. 1, 2008 for Chinese Patent Application No. 2005800058321.
International Search Report and Written Opinion for International Application No. PCT/US2005/019328 dated Aug. 14, 2006.
Partial International Search Report for International Application No. PCT/US2005/019328 dated Jul. 6, 2006.

(Continued)

*Primary Examiner*—Chandra Chaudhari
(74) *Attorney, Agent, or Firm*—Patterson & Sheridan, LLP

(57) ABSTRACT

Methods are provided for depositing materials in forming semiconductor devices on a substrate, such as metal oxide transistors. In one embodiment, the invention generally provides a method of processing a substrate including forming a gate dielectric on a substrate having a first conductivity, forming a gate electrode on the gate dielectric, forming a first pair of sidewall spacers along laterally opposite sidewalls of the gate electrode, etching a pair of source/drain region definitions on opposite sides of the electrode, depositing a silicon carbide material selectively in the source/drain region definitions, and implanting a dopant in the deposited silicon carbide material to form a source/drain region having a second conductivity.

18 Claims, 3 Drawing Sheets

OTHER PUBLICATIONS

Ghani, et al., "A 90nm High Volume Manufacturing Logic Technology Featuring Novel 45nm Gate Length Strained Silicon CMOS Transistors," pp. 11.6.1-11.6.3, IEEE 2003.

Nouri, et al., A Systematic Study of Trade-Offs in Engineering a Locally Strained pMOSFET, IEDM Technical Digest. IEEE International 13-15. Dec. 2004, pp. 1055-1058.

P.R. Chidambaram article, 35% Drive Current Improvement from Recessed-SiGe Drain Extensions on 37 nm Gate Length PMOS. 2004 Symposium on VLSI Technology Digest of Technical Papers, pp. 48-49.

S. Thompson et al. article, "A 90 nm Logic Technology Featuring 50nm Strained Silicon Channel Transistors, 7 Layers of Cu Interconnects, Low k ILD, and 1 um2 SRAM Cell" 2002 IEEE.

Scott E. Thompson Article, "A Logic Nanotechnology Featuring Strained-Silicon," IEEE Electron Device Letter, vol. 25, No. 4, pp. 191-193, Apr. 2004.

Victor Chan article, "High Speed 45nm Length CMOSFETs Integrated Into a 90nm Bulk Technology Incorporating Strain Engineering", 2003 IEEE, pp. 3.8.1-3.8.4.

Yang article, "High Performance CMOS Fabricated on Hybrid Substrate with Different Crystal Orientations", 2003 IEEE.

* cited by examiner

METHODS FOR FORMING A TRANSISTOR

CROSS-REFERENCE TO RELATED APPLICATIONS

This application is a continuation of U.S. patent application Ser. No. 11/123,588, filed May 6, 2005 now U.S. Pat. No. 7,413,957, which claims benefit of U.S. provisional patent application Ser. No. 60/583,079, filed Jun. 24, 2004, which are both incorporated herein by reference.

BACKGROUND OF THE INVENTION

1. Field of the Invention

Embodiments of the invention generally relate to the field of semiconductor manufacturing processes and devices, more particular, to methods of depositing silicon-containing films forming semiconductor devices.

2. Description of the Related Art

As smaller transistors are manufactured, ultra shallow source/drain junctions for sub-100 nm CMOS (complementary metal-oxide semiconductor) devices, such as silicon-containing MOSFET (metal oxide semiconductor field effect transistor) devices, are becoming more challenging to produce. Such MOS(FET) transistors may include p-channel MOS (PMOS) transistors, and n-channel MOS (NMOS) transistors, depending on the dopant conductivity types, whereas the PMOS has a p-type channel, i.e., holes are responsible for conduction in the channel and the NMOS has an n-type channel, i.e., the electrons are responsible for conduction in the channel.

Silicon based materials may be used in device creation for MOSFET devices. For example, in a PMOS application, the film in a recessed area of the transistor is usually silicon-germanium, and for a NMOS application, the film in the recessed area may be SiC. Silicon-germanium is advantageously used to implant more boron than silicon alone to reduce junction resistivity, which improves device performance, for example, the silicon-germanium interface with the silicide layer at the substrate surface has a lower Schottky barrier than the silicon interface with silicon-germanium.

The recessed areas comprise source/drain extension or source/drain features, which are manufactured by etching silicon to make a recessed source/drain feature and subsequently filling the etched surface with a selectively grown silicon-germanium epilayer. The mismatch of lattices between silicon and the silicon-germanium material generates compressive stress which is transferred in the lateral dimension of the junction to create compressive strain in the PMOS channel and to increase mobility of the holes and improve device performance.

Selective silicon-epitaxial (Si-epitaxial) deposition and silicon-germanium-epitaxial deposition permits growth of epilayers on silicon (Si) moats with no growth on dielectric areas. Selective epitaxy can be used in semiconductor devices, such as within source/drains, source/drain extensions, contact plugs, and base layer deposition of bipolar devices. Additionally, selective epitaxy permits near complete dopant activation with in-situ doping, so that the post annealing process may be omitted. Therefore, junction depth can be defined accurately by silicon etching and selective epitaxy. Improved junction depth also produces compressive stress. One example of the use of silicon containing materials in device creation is for MOSFET devices.

However, in ultra shallow source/drain junction applications for use in decreasing feature sizes, conventional manufacturing processes result in increased series resistance and reduced compressive stress in PMOS devices. Also, silicidation of the surface of the source/drain regions of a transistor results in junction consumption that increases the series resistance even further and produces tensile stress which counteracts the desired compressive stress formed in the transistor. As such, conventional etching and deposition processes for MOSFET under the silicon-germanium incorporation have been less than desirable and have resulted in undesirable dopant diffusion and undesirable stress relaxation effects.

Therefore, there is a need to have a process for selectively and epitaxially depositing silicon and silicon compounds that have an enriched dopant concentration and incorporation into semiconductor devices with improved device performance.

SUMMARY OF THE INVENTION

The invention applies to depositing materials for use in semiconductor devices. In one embodiment, a method is provided for processing a substrate including forming a gate dielectric on a substrate having a first conductivity, forming a gate electrode on the gate dielectric, implanting a first dopant in the substrate surface to form source/drain regions having a second conductivity on opposite sides of the electrode, wherein the source/drain regions have a vertical portion and a horizontal portion, forming a pair of sidewall spacers along laterally opposite sidewalls of the gate electrode, wherein the first pair of sidewall spacers cover a first vertical portion of the source/drain regions, implanting the first dopant to increase the horizontal portion of the source/drain regions, removing a portion of the first pair of sidewall spacers to expose a greater vertical portion of the source/drain regions, etching a pair of feature definitions in the source/drain regions on opposite sides of the electrode, wherein the etching removes a least a portion of the source/drain regions, depositing a silicon-germanium material selectively in the feature definitions to form silicon-germanium source/drain regions, and depositing a sidewall material on the pair of sidewall spacers to cover a first vertical portion of the silicon-germanium source/drain regions.

In another embodiment, a method is provided for processing a substrate including forming a gate dielectric on a substrate having a first conductivity, forming a gate electrode on the gate dielectric, forming a first pair of sidewall spacers along laterally opposite sidewalls of the gate electrode, etching a pair of source/drain region definitions on opposite sides of the electrode, depositing a silicon-germanium material selectively in the source/drain region definitions, and implanting a dopant in the deposited silicon-germanium material to form a source/drain region having a second conductivity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention provides processes for forming semiconductor devices including the epitaxial deposition of silicon containing compounds. Herein, silicon containing compounds include deposited layers or films of silicon (Si), silicon-germanium (SiGe), silicon carbide (SiC), silicon germanium carbide (SiGeC), doped variants thereof, and combinations thereof.

The processes of the invention can be carried out in equipment known in the art of atomic layer epitaxy (ALE), chemical vapor deposition (CVD0 and atomic layer deposition (ALD). The apparatus brings the sources into contact with a heated substrate on which the silicon compound films are grown. The processes can operate at a range of pressures from about 1 mTorr to about 2,300 Torr, preferably between about 0.1 Torr and about 200 Torr. Hardware that can be used to deposit silicon-containing films includes the Epi Centura® system, the DPS II™ silicon etch tool, and the Poly Gen® system available from Applied Materials, Inc., located in Santa Clara, Calif. A suitable ALD apparatus is disclosed in U.S. Patent Application Publication 20030079686, assigned to Applied Material, Inc., and entitled "Gas Delivery Apparatus and Methods for ALD", which publication is incorporated herein by reference in entirety for the purpose of describing the apparatus. Other suitable apparatus include batch, high-temperature furnaces, as known in the art.

The following process embodiments form structures using silicon-germanium materials. In a first embodiment, a method is provided for forming silicon-germanium source/drain regions in etched portions of the silicon material. In a second embodiment an integrated structure, such as a MOSFET structure, is formed be selective silicon-germanium material deposition to form source/drain region definitions, and implanting a dopant in the deposited silicon-germanium material to form a doped source/drain region.

FIGS. 1A-1E illustrate steps for one process embodiment of forming an integrated structure as described in the second embodiment.

Figure 1A:
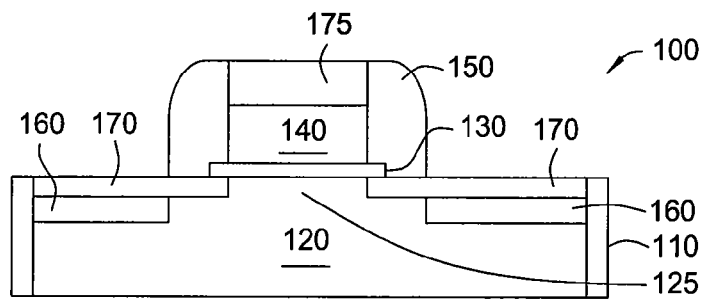
FIGS. 1A-G illustrate one embodiment of a silicon-germanium integration scheme.

FIG. 1A illustrates a substrate 100 which includes a partially fabricated p-type metal oxide semiconductor device (PMOS). The PMOS has a p-type channel, i.e., holes are responsible for conduction in the channel. The substrate 100 includes a plurality of field isolation regions 110 (field isolation structures 110) used to isolate wells of different conductivity types and to isolate adjacent transistors. Field isolation regions 110 are preferably shallow trench isolation (STI) regions formed by etching a trench into substrate 100 and then filling the trench with a deposited oxide Suitable insulators such as nitrides may be used instead of oxides if desired.

The substrate 100 includes an n-type region 120 having a first conductivity formed between isolation regions 110. A suitable conductivity may be in the range between about $1\times10^{17}$ atoms/cm$^3$ and about $1\times10^{19}$ atoms/cm$^3$. The n-type region 120 may be formed by one or more implant processes using phosphorous atoms, and optionally, a final implant of arsenic atoms into the silicon substrate 100. The n-type region 120 may be formed by other means including providing an initially doped substrate, or depositing an in situ doped semiconductor material with a desired conductivity.

A gate dielectric layer 130 is formed on the top surface of n-type region 120. Gate dielectric layer 130 may comprise, for example, a silicon oxide, a silicon nitride, or a silicon oxynitride layer, which, for example, may be deposited to a thickness between about 5 Å and about 100 Å. A gate electrode 140 is formed on gate dielectric layer 130 by depositing polysilicon onto the gate dielectric layer 130, for example, between about 1000 Å and about 3500 Å thick, and patterning the polysilicon with conventionally known photolithographic techniques. Alternatively, the gate electrode 140 may comprise another conductive material, such as a metal.

The exposed substrate surface of the n-type region 120 on opposing sides of the gate electrode is implanted with p-dopant ions into an exposed upper surface of the gate electrode 140. The dopant ions may, for example, be boron ions or other suitable p-type ions. The ions form conductive p-doped regions 170 in the n-type region 120 and a conductive p-doped region 175 in the gate electrode 140. The p-doped regions 170 form an initial source/drain region for the structure and have a p-type conductivity different than the n-type regions.

Sidewall spacers 150 may be formed along laterally opposite sidewalls of the gate electrode 140. The sidewall spacers may be formed to a thickness, for example, between about 50 Å and about 300 Å, necessary to electrically isolate the gate electrode 140 from subsequently deposited material. The sidewall spacer 150 may comprise a suitable insulating material, for example, silicon nitride, silicon oxide, silicon oxynitride, or silicon carbide deposited from any conventionally known process, such as chemical vapor deposition, and etched to form the shape as shown in FIG. 1A.

The exposed substrate surface of the n-type region 120 on opposing sides of the gate electrode is implanted with additional or secondary p-dopant ions, such as boron, at a higher implantation energy (and into an exposed upper surface of the gate electrode 140). The increased implantation energy results in p-doped ions being implanted deeper into the n-type region 120 to create secondary p-doped conductive regions 160. The sidewall spacers 150 form a mask which prevents implantation of the ions into the n-type region 120 therebelow. The secondary p-doped conductive regions 160 and the p-doped regions 170 may create a new source/drain material having a different conductivity. A channel 125 is defined between inner edges of the p-doped regions 170, and subsequently regions 160 described herein, for ion mobility in the structure.

Figure 1B:
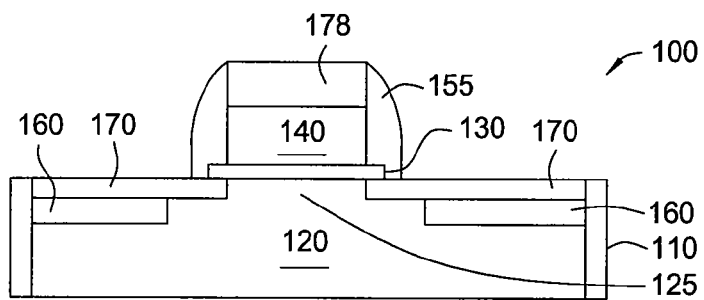

FIG. 1B shows etching of the sidewall spacers 150 to remove at least a portion of the sidewall spacer to form a reduced sidewall spacers 155. Alternatively, the entire sidewall spacers 150 may be removed, for example, in embodiments where the source/drain extension regions 170 extend under the gate dielectric 130. The etching of the sidewalls spacers may also result in a reduced doped polysilicon gate portion 178. Optionally, a hard mask (not shown) is deposited on the source/drain extension regions 170 and p-doped-region 175 to prevent loss of material during etching of the sidewall spacers 150. The hardmask material may be any material used in hardmask application, including, for example, silicon oxide or silicon nitride, and may be deposited by any process including, for example, plasma enhanced chemical vapor deposition (PECVD) and low pressure chemical vapor deposition (LPCVD).

The n-type region 120 including at least a portion of the secondary p-doped conductive regions 160 and the p-doped regions 170 is then etched to form source/drain definitions 180 that are disposed on opposite sides of the gate electrode 140 and adjacent the sidewall spacers 155. In one embodiment of the etch process, the region 120 is anisotropically etched or isotropically etched to etch the region vertically for anisotropically etching and also horizontally, or laterally, as well as vertically for isotropically etching. Sufficient horizontal etching may produce recesses (not shown) that extend under the spacers 155.

Figure 1C:
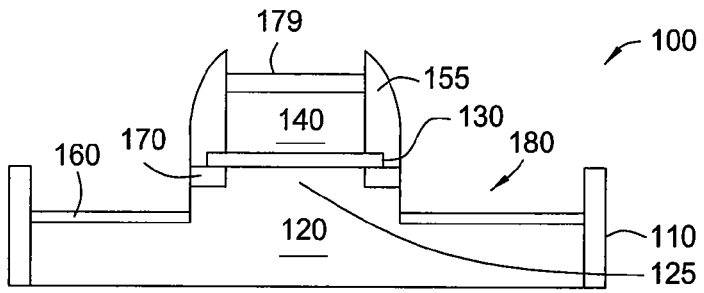

The anisotropically etching process may form a substantially vertical sidewall and bottom of the definitions as shown in FIG. 1C. Alternatively, the definitions may comprise a concave shape or other desired structure. A portion of the secondary p-doped conductive regions 160 and the p-doped regions 170 may remain after forming the definitions 180 as shown in FIG. 1C. The definitions 180 may be of any necessary dimensions, for example, a depth of between about 50 Å and about 1500 Å and a width that may range form the isolation regions 110 to the outer portion of the sidewall spacers 155. The etch process may also remove a portion of the reduced doped polysilicon gate portion 178 to form residual doped polysilicon gate portion 179. A hard mask (not shown) may be deposited on portions such as the structure, for example, the electrode 140 and gate portion 178, to prevent loss of material during the etching process.

Figure 1D:
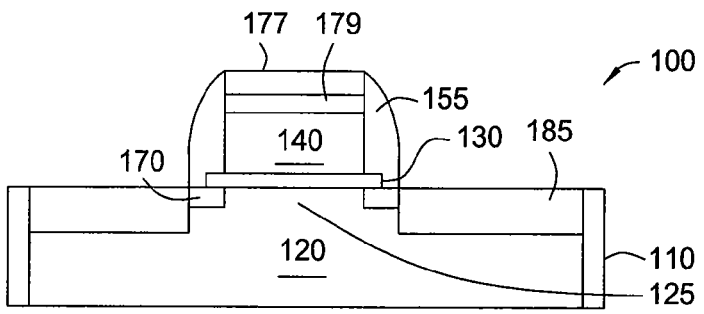

The source/drain definitions 180 are then filled with a silicon containing materials, such as a silicon-germanium material or silicon carbide as desired for device function, as shown in FIG. 1D. The residual portions of the secondary p-doped conductive regions 160 may be absorbed into the deposited material. The silicon germanium material may also be deposited on the residual doped polysilicon gate portion 179 to completely form the polysilicon gate layer 177. The definitions 180 are designed so as to extend further towards the gate dielectric than allowed in the ion implantation method as shown in FIG. 1A, thus allowing for stress inducing regions 185 to be formed closer to the channel 125.

The silicon containing material is deposited by a process free of dopants and generally comprises silicon-germanium material (SiGe) with a germanium concentration at about 1 atomic percent to about 30 atomic percent. Alternatively, the deposited silicon-germanium material may further include dopants, such as boron, or other necessary materials for forming source/drain materials. Examples of process for depositing silicon germanium material, and other, is disclosed in U.S. application Ser. No. 10/683,937, filed on Oct. 10, 2003, issued as U.S. Pat. No. 7,166,528 on Jan. 23, 2007, and U.S. application Ser. No. 10/845,984, filed on May 14, 2004, issued as U.S. Pat. No. 7,132,338 on Nov. 7, 2006, both of which are incorporated by reference to the extent not inconsistent with the claimed aspects and disclosure herein. Silicon-germanium is used for PMOS application for several reasons. A Silicon-germanium material incorporates more boron than silicon alone, thus, junction resistivity is lowered. Additionally, the Silicon-germanium/silicide layer interface at the substrate surface has a lower Schottky barrier than the Si/silicide interface.

Further, Silicon-germanium grown epitaxially on the top of silicon has increased compressive stress inside the film compared to silicon/silicon interface because the lattice constant of silicon-germanium is larger than that of silicon. The compressive stress is transferred in the lateral dimension to create compressive strain in the PMOS channel and to increase mobility of the holes. For NMOS application, SiC can be used in the recessed areas to create tensile stress in the channel, since the lattice constant of SiC is smaller than that of silicon. The tensile stress is transferred into the channel and increases the electron mobility.

The silicon containing material of the stress inducing regions 185 is selectively deposited on silicon, such as, in the definitions 180 and on an etched portion of the gate portion 179. The silicon containing material is deposited in a sufficient amount to fill the definitions 180 to the level of the gate dielectric material 130, referred to form a source/drain region for the stress inducing regions 185. The silicon containing material will provide a new p-doped source/drain region having a different p-type conductivity than the prior source/drain region of the source/drain regions formed by the secondary p-doped conductive regions 160 and the p-doped regions 170.

Alternatively, the deposited silicon containing material of the stress inducing regions 185 may then be doped by an ion implantation process conventionally known in the art to form source/drain regions therein. The silicon containing material may be ion implanted with sufficient dopants (e.g., B, As or P) at a dopant concentration from about $1 \times 10^{18}$ atoms/cm$^3$ to about $2.5 \times 10^{21}$ atoms/cm$^3$, preferably at about $2 \times 10^{20}$ atoms/cm$^3$.

It is believed that the structure made from the silicon-germanium material, either doped or undoped, provides increased stress and strain at the channel 125 to increase ion mobility and improved functioning of the transistor structure. The source/drain regions are believed to allow for a greater amount of material of the source/drain regions 170, as well as forming such regions closer to the channel 125, providing increased stress and strain to the channel 125, thereby resulting in improved structure performance.

Figure 1E:
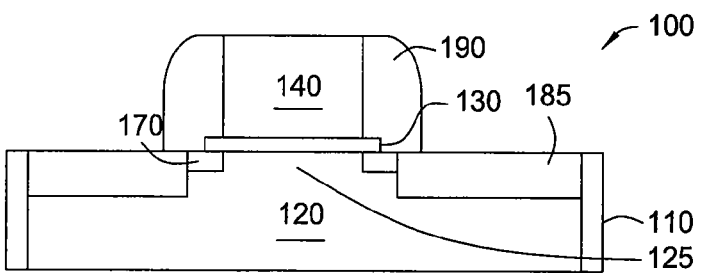

FIG. 1E illustrates depositing additional sidewall spacer material to form enhanced sidewall spacers 190 to further isolate the gate electrode 140 from the source/drain regions 170. The additional material for the sidewall spacers may be deposited by the same process and same materials as described for sidewall spacers 150. Alternatively, the sidewall spacers 190 may be deposited prior to an ion implantation process described above. The sidewall spacers typically expose a substantial portion of the silicon-containing material for subsequent process as described herein.

The substrate may then be subjected to additional processing such as anneal, a capping layer, and/or a salicidation process as described herein for the first embodiment.

Figure 1F:
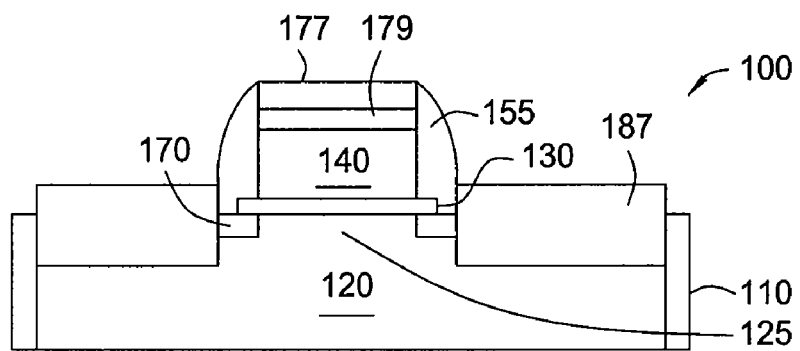
Figure 1G:
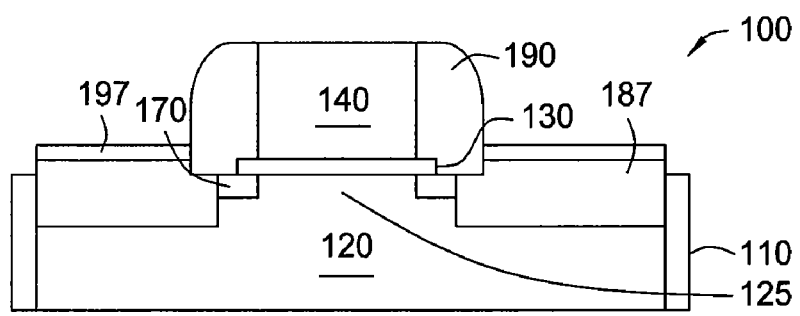

FIGS. 1F and 1G illustrate an alternative embodiment of the transistor having silicon-germanium material deposited in excess amounts to form a protrusion or extension 187 above the level of the gate dielectric material 130, referred to as a "raised" source/drain region. The raised source/drain extension 187 is believed to increase compressive stress and channel strain, providing for improved mobility of holes, and thus, improved device performance. The raised source/drain extension 187, for example, may be between about 20 and about 60 nm above the level of the gate dielectric material 130. FIG. 1G illustrates depositing additional sidewall spacer material to form enhanced sidewall spacers 190 to further isolate the gate electrode 140 from the source/drain regions 170.

FIG. 1G further illustrates a salicidation process, such as nickel silicide formation, used to form a low resistance silicide 197 on the deposited silicon containing materials of the source/drain regions of the source inducing regions 185. The silicide formation process may be one conventionally known in the art, such as cobalt and titanium nitride deposition and anneal to form a cobalt silicide. Other materials, such as nickel for nickel silicide, and other metals suitable for silicide formation may be used to form the silicide 197 herein. Additionally processes, such as annealing process following ion implantation or capping layers (not shown) over the gate electrode 140 (and, optionally, silicide) and source/drain regions of the regions 185 (and silicides 197) may be performed as necessary.

Figure 2A:
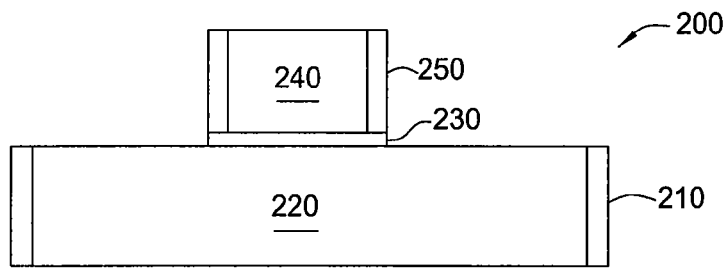
FIGS. 2A-E illustrate another embodiment of a silicon-germanium integration scheme.

FIGS. 2A-2E illustrate steps for one process embodiment of forming an integrated structure with source/drain extension regions. FIG. 2A illustrates a substrate 200 which includes a partially fabricated p-type metal oxide semiconductor device (PMOS). Substrate 200 includes a plurality of field isolation regions 210 used to isolate wells of different conductivity types and to isolate adjacent transistors. Field isolation regions 210 are preferably shallow trench isolation (STI) regions formed by etching a trench into substrate 200 and then filling the trench with a deposited oxide, and suitable insulators, other than oxides, such as nitrides may be used if desired.

The substrate 200 includes an n-type region 220 having a first conductivity formed between isolation regions 210. A suitable conductivity may be in the range between about $1 \times 10^{17}$ atoms/cm$^3$ and about $1 \times 10^{19}$ atoms/cm$^3$. The n-type region 220 may be formed by one or more implant processes using phosphorous atoms and optionally, a final implant of arsenic atoms into the silicon substrate 200. The n-type region 220 may be formed by other means including providing an initially doped substrate, or depositing an in situ doped semiconductor material with a desired conductivity.

A gate dielectric layer 230 is formed on the top surface of n-type region 220. Gate dielectric layer 230 may comprise, for example, a silicon oxide, a silicon nitride, or a silicon oxynitride layers, which, for example, may be deposited to a thickness between about 5 Å and about 200 Å. A gate electrode 240 is formed on gate dielectric layer 230 and, for example, may be deposited with polysilicon between about 1000 Å and about 3500 Å thick and patterned with conventionally known photolithographic techniques. Alternatively, the gate electrode 240 may comprise another conductive material, such as a metal.

Sidewall spacers 250 may be formed along laterally opposite sidewalls of the gate electrode 240. The sidewall spacers may be formed, for example, to a thickness between about 50 Å and about 300 Å, or any other thickness necessary to electrically isolate the gate electrode 240 from subsequently deposited material. The sidewall spacer may comprise suitable insulating materials, for example, silicon nitride, silicon oxide, silicon oxynitride, or silicon carbide, deposited from any conventionally known process, such as chemical vapor deposition, and etched to form the sidewall spacer as shown in FIG. 2A.

Figure 2B:
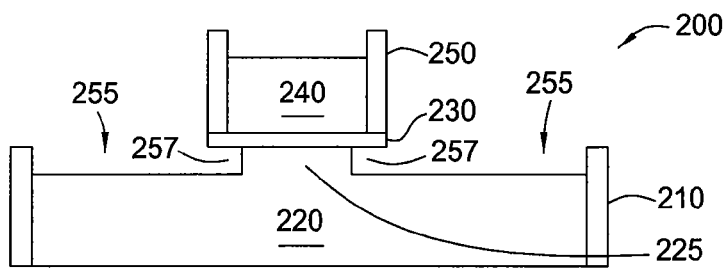

The n-type region 220 is then etched to form source/drain definitions 255 that are disposed on opposite sides of the gate electrode 240 and adjacent the sidewall spacers 250. The source/drain definitions 255 further define a channel 225 for ion mobility in the structure. In one embodiment of the etch process, the region 220 is isotropically etched to etch the region vertically into the region 220 and horizontally, or laterally. Sufficient horizontal etching may produce recesses 257 that extend under the gate dielectric layer 230 as shown in FIG. 2B. The etching process may comprise a substantially vertical sidewall and bottom of the definitions as shown in FIG. 2B, and alternatively, may comprise a concave shape or other desired structure. The definitions 255 may be of any necessary dimensions, for example, a depth of between about 50 and about 1500 and a width as from the isolation structures 210 to the gate dielectric layer 230, and below as necessary.

Figure 2C:
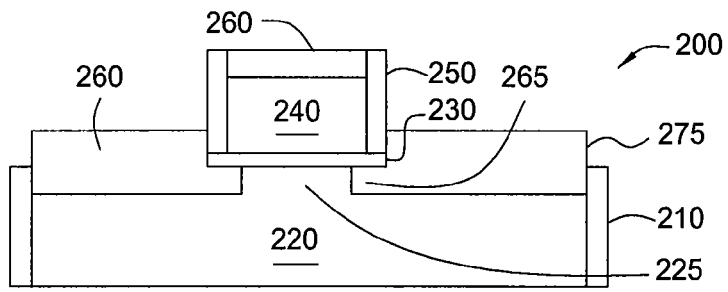

The source/drain definitions 255 are then filled with a silicon containing materials 260, such as a silicon-germanium material or silicon carbide as desired for device function, as shown in FIG. 2C. The silicon containing material is deposited by a process free of dopants and generally comprises silicon-germanium material (SiGe) with a germanium concentration at about 1 atomic percent to about 30 atomic percent. Examples of process for depositing silicon germanium material, and other suitable materials, is disclosed in U.S. application Ser. No. 10/683,937, filed on Oct. 10, 2003, issued as U.S. Pat. No. 7,166,528 on Jan. 23, 2007, and U.S. application Ser. No. 10/845,984, filed on May 14, 2004, issued as U.S. Pat. No. 7,132,338, on Nov. 7, 2006, both of which are incorporated by reference to the extent not inconsistent with the claimed aspects and disclosure herein.

The silicon containing material 260 is selectively deposited on silicon, such as, in the definitions 255 and the silicon containing material 260 is selectively deposited on etched portion of the gate electrode 240. The silicon containing material 260 is deposited in a sufficient amount to fill the definitions 255, and alternatively, deposited in excess amounts to form a protrusion 275 above the level of the gate dielectric layer 230, referred to as a "raised" source/drain region. The silicon containing material 260 is also deposited to fill the recesses 257 extending under the gate dielectric layer to form extensions 265.

Alternatively, the deposited silicon containing material 260 may then be doped by an ion implantation process conventionally known in the art to form source/drain regions 270. The silicon containing material 260 may be ion implanted with sufficient dopants (e.g., B, As or P) at a dopant concentration from about $1 \times 10^{18}$ atoms/cm$^3$ to about $2.5 \times 10^{21}$ atoms/cm$^3$, preferably at about $2 \times 10^{20}$ atoms/cm$^3$.

Figure 2D:
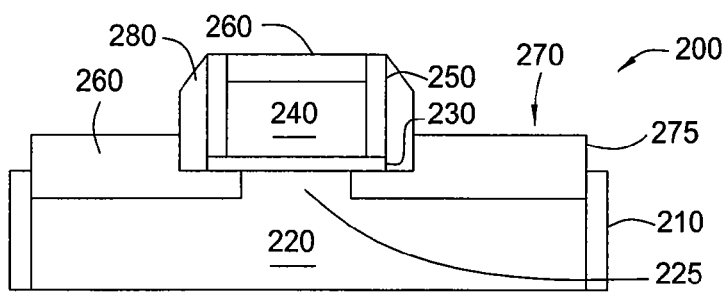

FIG. 2D illustrates depositing a second set of sidewall spacers 280 to further isolate the gate electrode 240 from the source/drain regions 270. The second set of sidewall spacers may be deposited by the same process and same materials as described for sidewall spacers 250. In the embodiment shown on FIG. 2D, the source/drain region has been etched prior to the deposition of the sidewall spacers 280 to provide sufficient isolation for the gate electrode 240. The invention contemplates deposition of the sidewall spacers 280 without any processing, such as etching of the source/drain regions 270. Alternatively, the sidewall spacers 280 may be deposited prior to an ion implantation process described above. The sidewall spacers typically expose a substantial portion of the silicon-containing material for subsequent process as described herein.

It is believed that the structure made from the silicon-germanium material (or silicon carbide material for NMOS), either doped or undoped, as described in the first embodiment, provides increased stress and strain at the channel 225 to increase ion mobility and improved functioning of the transistor structure. The use of undoped silicon-germanium material is believed to allow separate requirements of forming a shallow extension junction from strain generation. Thus, the undoped silicon-germanium material is further believed to allow for a greater depth of the source/drain regions 270. This understanding allows for flexibility in the shaping of the source/drain regions 270 and to allow for deeper regions providing increase stress to the channel. The further allows the silicon-germanium regions to optimize stress without concern of relaxation of stress during implantation and annealing processes used to form the junction. Additionally, it is believed that the use of raised and/or extended source/drain regions further adds compressive stress and strain to the structure.

Figure 2E:
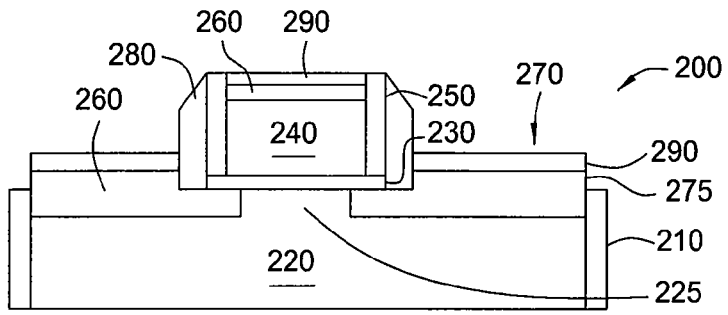

FIG. 2E illustrates a salicidation process to form a low resistance silicide 290 on the deposited silicon containing materials 260 of the source/drain regions 270. The silicide 290 formation process may be one conventionally known in the art, such as cobalt and titanium nitride deposition and anneal to form a cobalt silicide. Other materials, such as nickel for nickel silicide, and other metals suitable for silicide formation may be used to form the silicide 290 herein. Additionally processes, such as annealing process following ion implantation or capping layers (not shown) over the gate electrode 240 (and silicide 290) and source/drain regions 270 (and suicides 290) and may be performed as necessary.

While the foregoing is directed to embodiments of the present invention, other and further embodiments of the invention may be devised without departing from the basic scope thereof, and the scope thereof is determined by the claims that follow.

What is claimed is:

1. A method for processing a substrate, sequentially comprising:
   forming a gate dielectric on a substrate having a first conductivity;
   forming a gate electrode on the gate dielectric;
   implanting a first dopant in the substrate to form first source/drain regions having a second conductivity on opposite sides of the gate electrode;
   forming a pair of sidewall spacers along laterally opposite sidewalls of the gate electrode, wherein the pair of sidewall spacers cover a first portion of the first source/drain regions while leaving a second portion of the first source/drain regions exposed;
   implanting the first dopant to increase depth of the second portion of the first source/drain regions;
   removing a portion of the pair of sidewall spacers to expose some of the first portion of the first source/drain regions;
   etching a pair of feature definitions in the first source/drain regions on opposite sides of the gate electrode, wherein the etching removes at least a portion of the exposed first source/drain regions;
   depositing a silicon carbide material selectively in the feature definitions to form second source/drain regions; and
   depositing a sidewall material on the pair of sidewall spacers to cover a first portion of the second source/drain regions while leaving a second portion of the second source/drain regions exposed.

2. The method of claim 1, further comprising implanting a second dopant in the second source/drain regions to form source/drain regions having a third conductivity different than the second conductivity, wherein the second conductivity and the third conductivity are of the same type.

3. The method of claim 1, wherein the first and second dopants are selected from the group consisting of boron, arsenic, phosphorus, and combinations thereof.

4. The method of claim 2, wherein the first conductivity comprises a n-type conductivity and the second and third conductivities comprise a p-type conductivity.

5. The method of claim 2, wherein the first conductivity comprises a p-type conductivity and the second and third conductivities comprise a n-type conductivity.

6. The method of claim 1, further comprising forming a metal silicide from the second portion of the second source/drain regions during a metal silicidation process.

7. The method of claim 6, wherein the metal silicide comprises nickel silicide.

8. The method of claim 1, further comprising annealing the substrate following each implantation of the dopants.

9. The method of claim 1, further comprising depositing the silicon carbide material to form a protrusion extending beyond the upper surface of the gate dielectric.

10. A method for processing a substrate, sequentially comprising:
    forming a gate dielectric on a substrate having a first conductivity;
    forming a gate electrode on the gate dielectric;
    implanting a first dopant in the substrate to form first source/drain regions having a second conductivity on opposite sides of the gate electrode;
    forming a pair of sidewall spacers along laterally opposite sidewalls of the gate electrode, wherein the pair of sidewall spacers cover a first portion of the first source/drain regions while leaving a second portion of the first source/drain regions exposed;
    implanting the first dopant to increase depth of the second portion of the first source/drain regions;
    removing a portion of the pair of sidewall spacers to expose some of the first portion of the first source/drain regions;
    etching a pair of feature definitions comprising a concave shape in the first source/drain regions on opposite sides of the gate electrode, wherein the etching removes at least a portion of the exposed first source/drain regions;
    depositing a silicon carbide material selectively in the feature definitions to form second source/drain regions; and
    depositing a sidewall material on the pair of sidewall spacers to cover a first portion of the second source/drain regions while leaving a second portion of the second source/drain regions exposed.

11. The method of claim 10, further comprising implanting a second dopant in the second source/drain regions to form source/drain regions having a third conductivity different than the second conductivity, wherein the second conductivity and the third conductivity are of the same type.

12. The method of claim 10, wherein the first and second dopants are selected from the group consisting of boron, arsenic, phosphorus, and combinations thereof.

13. The method of claim 11, wherein the first conductivity comprises a n-type conductivity and the second and third conductivities comprise a p-type conductivity.

14. The method of claim 11, wherein the first conductivity comprises a p-type conductivity and the second and third conductivities comprise a n-type conductivity.

15. The method of claim 10, further comprising forming a metal silicide from the second portion of the second source/drain regions during a metal silicidation process.

16. The method of claim 15, wherein the metal silicide comprises nickel silicide.

17. The method of claim 10, further comprising annealing the substrate following each implantation of the dopants.

18. The method of claim 10, further comprising depositing the silicon carbide material to form a protrusion extending beyond the upper surface of the gate dielectric.

* * * * *

UNITED STATES PATENT AND TRADEMARK OFFICE
CERTIFICATE OF CORRECTION

PATENT NO.        : 7,833,869 B2
APPLICATION NO.   : 12/181942
DATED             : November 16, 2010
INVENTOR(S)       : Nouri et al.

It is certified that error appears in the above-identified patent and that said Letters Patent is hereby corrected as shown below:

Column 8, Line 67, please delete "suicides" and insert --silicides-- therefor.

Signed and Sealed this
Twenty-second Day of February, 2011

David J. Kappos
*Director of the United States Patent and Trademark Office*